(12) United States Patent
Zhang

(10) Patent No.: US 12,342,501 B1
(45) Date of Patent: Jun. 24, 2025

(54) WATER COOLING DEVICE WITH A SHOCK-ABSORBING STRUCTURE

(71) Applicant: Dongguan YiChen Intelligent Electronics Co., Ltd., Dongguan (CN)

(72) Inventor: Pan Zhang, Dongguan (CN)

(73) Assignee: Dongguan YiChen Intelligent Electronics Co., Ltd., Dongguan (CN)

( * ) Notice: Subject to any disclaimer, the term of this patent is extended or adjusted under 35 U.S.C. 154(b) by 0 days.

(21) Appl. No.: 19/070,580

(22) Filed: Mar. 5, 2025

(30) Foreign Application Priority Data

Jan. 26, 2025 (CN) .......................... 202520175151.4

(51) Int. Cl.
| | |
|---|---|
| H05K 7/20 | (2006.01) |
| F02B 39/00 | (2006.01) |
| F04D 13/06 | (2006.01) |
| F04D 29/40 | (2006.01) |
| F04D 29/66 | (2006.01) |
| F16F 15/08 | (2006.01) |
| F04B 39/06 | (2006.01) |

(52) U.S. Cl.
CPC ....... *H05K 7/20272* (2013.01); *F02B 39/005* (2013.01); *F04D 13/06* (2013.01); *F04D 29/406* (2013.01); *F04D 29/669* (2013.01); *F16F 15/08* (2013.01); *F04B 39/064* (2013.01); *F17C 2227/015* (2013.01)

(58) Field of Classification Search
CPC ... H05K 7/20272; F04D 13/06; F04D 29/406; F04D 29/669; F16F 15/08; F17C 2227/015; F04B 39/064; F02B 39/0005

USPC ....................................................... 165/80.4
See application file for complete search history.

(56) References Cited

U.S. PATENT DOCUMENTS

| | | | |
|---|---|---|---|
| 10,768,677 B2* | 9/2020 | Lin | F04D 13/0673 |
| 11,314,298 B2* | 4/2022 | Lin | H05K 7/20263 |
| 12,171,083 B2* | 12/2024 | Tsai | F04D 29/586 |
| 2006/0032625 A1* | 2/2006 | Angelis | F04D 13/12 165/247 |
| 2017/0339802 A1* | 11/2017 | Pan | F28D 15/00 |
| 2017/0347487 A1* | 11/2017 | Rudnicki | F28F 13/12 |
| 2020/0309018 A1* | 10/2020 | Deng | F01P 11/029 |

FOREIGN PATENT DOCUMENTS

CN      221884258      10/2024

* cited by examiner

*Primary Examiner* — Joel M Attey
(74) *Attorney, Agent, or Firm* — JEEN IP LAW, LLC

(57) ABSTRACT

The present invention discloses a water cooling device with a shock-absorbing structure, comprising a water cooling plate, a bottom shell, and an upper shell, wherein the upper wall of the water cooling plate is provided with a splitter plate, and the water cooling plate and the splitter plate enclose a first chamber; a first fluid inlet runs through the middle of the splitter plate, and a first fluid outlet is provided outside the splitter plate, one side of the bottom shell is provided with an inlet pipe connecting to the first fluid inlet; one side of the bottom shell is also provided with a flexible pipeline. A shock-absorbing pad between the bottom shell and upper shell effectively reduces the vibration transmission of water pump during start-up or operation to the bottom shell, thereby providing a flexible connection.

10 Claims, 14 Drawing Sheets

WATER COOLING DEVICE WITH A SHOCK-ABSORBING STRUCTURE

CROSS-REFERENCE TO RELATED APPLICATIONS

This application claims priority to Chinese Patent Application No. 202520175151.4, filed on Jan. 26, 2025, which is hereby incorporated by reference in its entirety.

TECHNICAL FIELD

The present invention relates to the field of computer water cooling devices, particularly to a water cooling device with a shock-absorbing structure.

BACKGROUND

The water-cooled radiator has an inlet and outlet, as well as a plurality of water channels inside, so that it can fully utilize the advantages of water cooling and take away more heat. This is how a water-cooled radiator works.

As computer performance improves, the demand for water-cooled cooling devices has also increased. One existing design is to integrate the water pump and water cooling plate to reduce the problem of pipeline clutter and stabilize fluid flow rate.

When a water pump and water cooling plate are generally integrated on the same carrier, however, the corresponding vibration generated by a water pump in operation will also act on the water cooling plate, and the long term direct contact of water cooling plate with the heating elements will also have an impact on the heating elements.

Chinese patent CN202420390082.4, for example, indicates that the inlet pipe and outlet pipe are disposed on the same carrier and in practical operation, the vibration of the water pump will also be fed back to the water cooling plate, affecting the stability of heating elements while generating noises.

SUMMARY

The main purpose of the present invention is to propose a water cooling device with a shock-absorbing structure, aiming to improve the structure of the flow channel, thereby reducing the vibration acting on the water cooling plate and ensuring stable heat dissipation.

To achieve the above purpose, the present invention proposes a water cooling device with a shock-absorbing structure, comprising:
  a water cooling plate, wherein the upper wall of the water cooling plate is provided with a splitter plate, and the water cooling plate and the splitter plate enclose a first chamber; a first fluid inlet runs through the middle of the splitter plate, a first fluid outlet is provided outside the splitter plate, and the first chamber is connected to the first fluid inlet and the fluid outlet, respectively;
  a bottom shell, wherein one side of the bottom shell is provided with an inlet pipe connecting to the first fluid inlet;
  one side of the bottom shell is provided with a flexible pipeline, and the first end of the flexible pipeline is connected to the first fluid outlet;
  and an upper shell, wherein the upper shell is located on the upper wall of the bottom shell, and a shock-absorbing pad is provided between the bottom shell and the upper shell, and the middle of the upper shell is provided with a second fluid inlet connecting to the second end of the flexible pipeline;
  a pump cover is provided on the upper wall of the upper shell, and the upper shell and pump cover enclose a second chamber, the second fluid inlet is provided at the bottom wall of the second chamber, and the second chamber is rotatably installed with an impeller having a rotor;
  a second fluid outlet connecting to a water outlet pipe is provided at the side wall of the second chamber;
  a stator that fits the device is provided at the upper wall of the pump cover; and
  when the stator drives the rotor to rotate, fluid sequentially passes through the inlet pipe, first fluid inlet, first chamber, second fluid outlet, flexible pipe, second fluid inlet, second chamber, second fluid outlet, and outlet pipe.

In practical design, the inlet pipe and outlet pipe are located on the bottom shell and upper shell, and a shock-absorbing pad between the bottom shell and upper shell effectively reduces the vibration transmission of water pump during start-up or operation to the bottom shell, thereby providing a flexible connection, and unlike traditional structures, a bottom shell installed between the water cooling plate and the upper shell serve as a transition, and a flexible tube provides the flexible connection between the first chamber and the second chamber, reducing the problem of resonance and improving the stability of the integrated use of water pump and water-cooled head;

the inlet pipe and outlet pipe are respectively connected to the water cooling system or heat dissipation device, thereby improving the stability of heat dissipation.

Where,
1. water cooling plate; 10. First chamber; 11. Heat dissipation copper strip; 12. Heat dissipation water channel; 13. return channel;
2. Splitter plate; 21. First fluid inlet; 22. First fluid outlet; 23. Groove, 3. Bottom shell; 31. Inlet pipe; 32. Surrounding portion; 33. Shock-absorbing pad; 301. First connecting valve port; 302. Second connecting valve port;
4. Flexible pipeline; 41. First end; 42. Second end,
5. Upper shell; 50. Containment chamber; 51. Second fluid inlet; 52. Second fluid outlet,
6. Pump cover; 60. Second chamber; 61; Outlet pipe,
7. Positioning shell; 70. Driving clearance; 71. Rotor; 72. Stator,
8. Impeller; 80. Decorative cover.

DESCRIPTION OF EMBODIMENTS

The technical solutions in the embodiments of the present invention will be described clearly and completely in conjunction with the accompanying drawings of the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

It should be noted that all directional indicators (such as up, down, left, right, front, back, top, bottom, inside, outside, vertical, horizontal, longitudinal, counterclockwise, clockwise, circumferential, radial, axial . . . ) in the embodiments of the present invention are only used to explain the relative position relationship and movement among various components in a particular posture (as shown in the accompanying drawings), and if that particular posture is changed, the directional indications will change accordingly.

In addition, descriptions involving terms "first," "second" and the like, if any, in the present invention are only for illustrative purposes and cannot be understood as indicating or implying relative importance or the number of features referred to. Therefore, the features defined with "first" and "second" may explicitly or implicitly include at least one or a plurality of the features. At the same time, the technical solutions of various embodiments can be combined with each other, but must be based on what those of ordinary skill in the art can achieve. The combination of technical solutions that result in contradiction or make it impossible to implement should be considered non-existent, and accordingly should not fall within the scope of protection required by this present invention.

Figure 1:
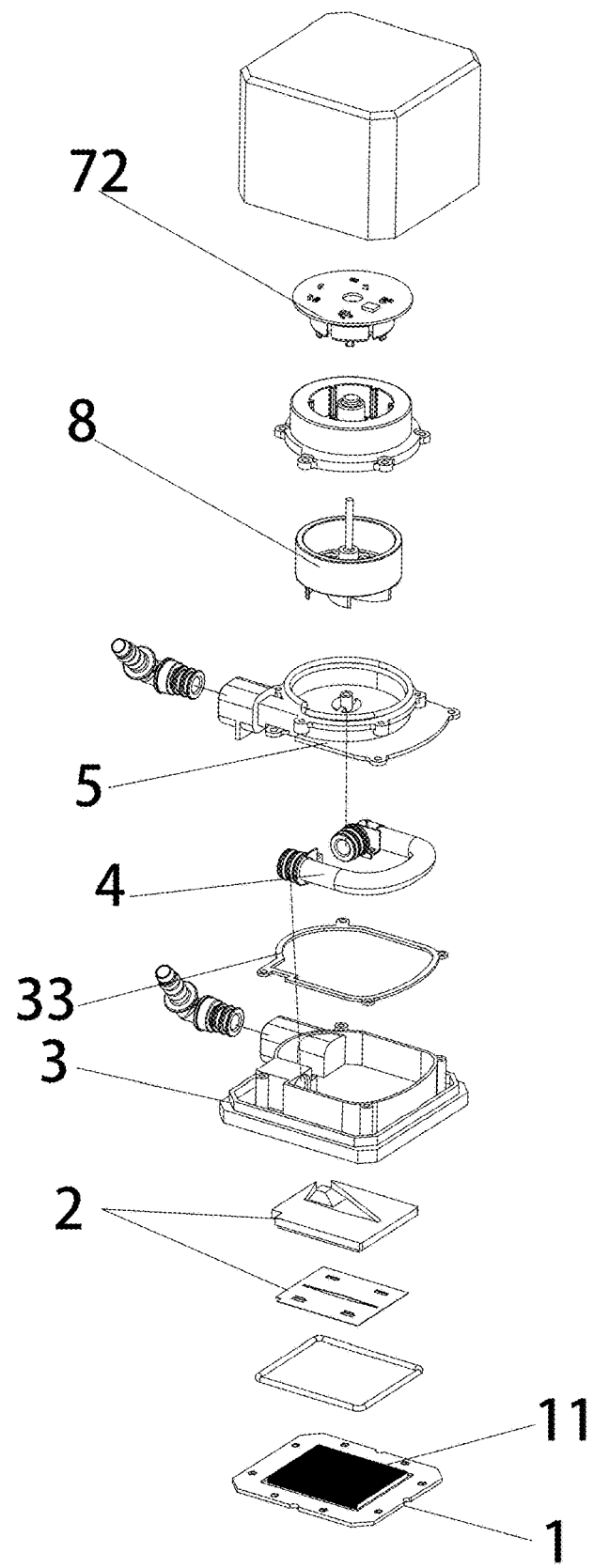
FIG. 1 is exploded view I of the present invention.
Figure 2:
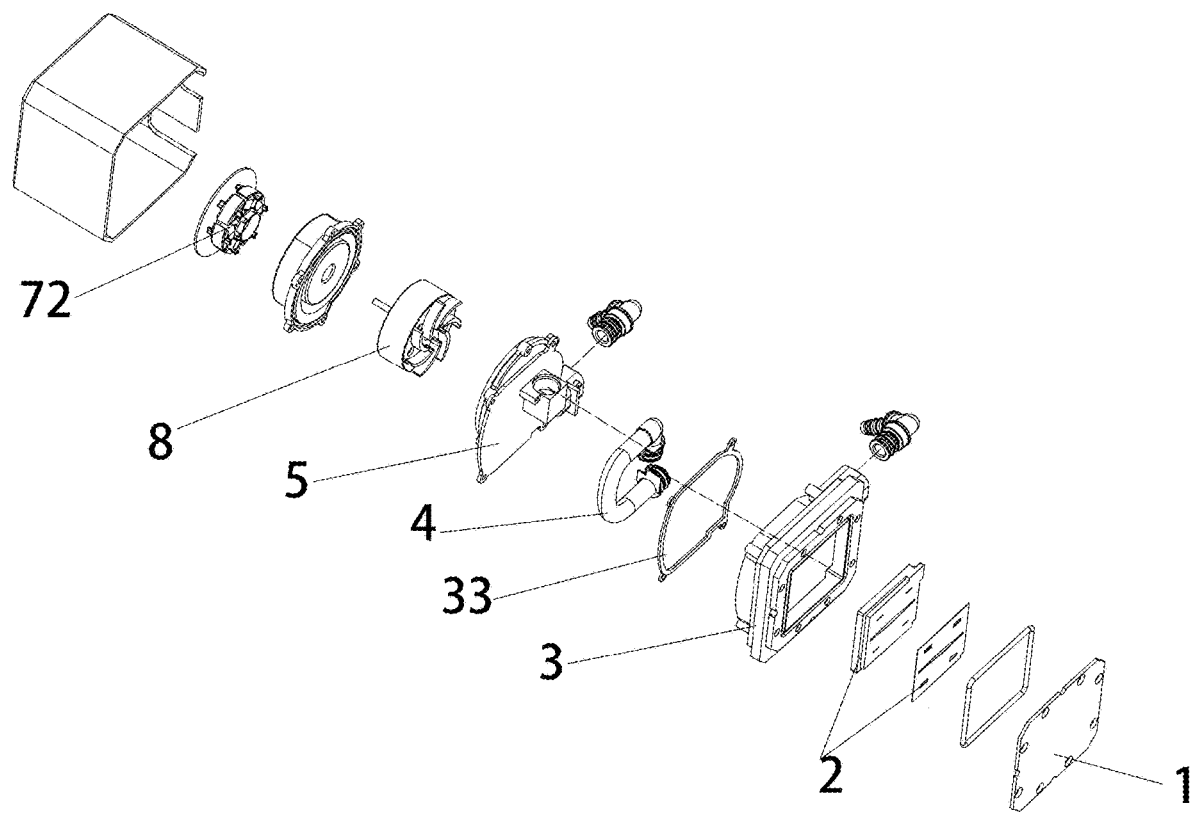
FIG. 2 is exploded view II of the present invention.
Figure 3:
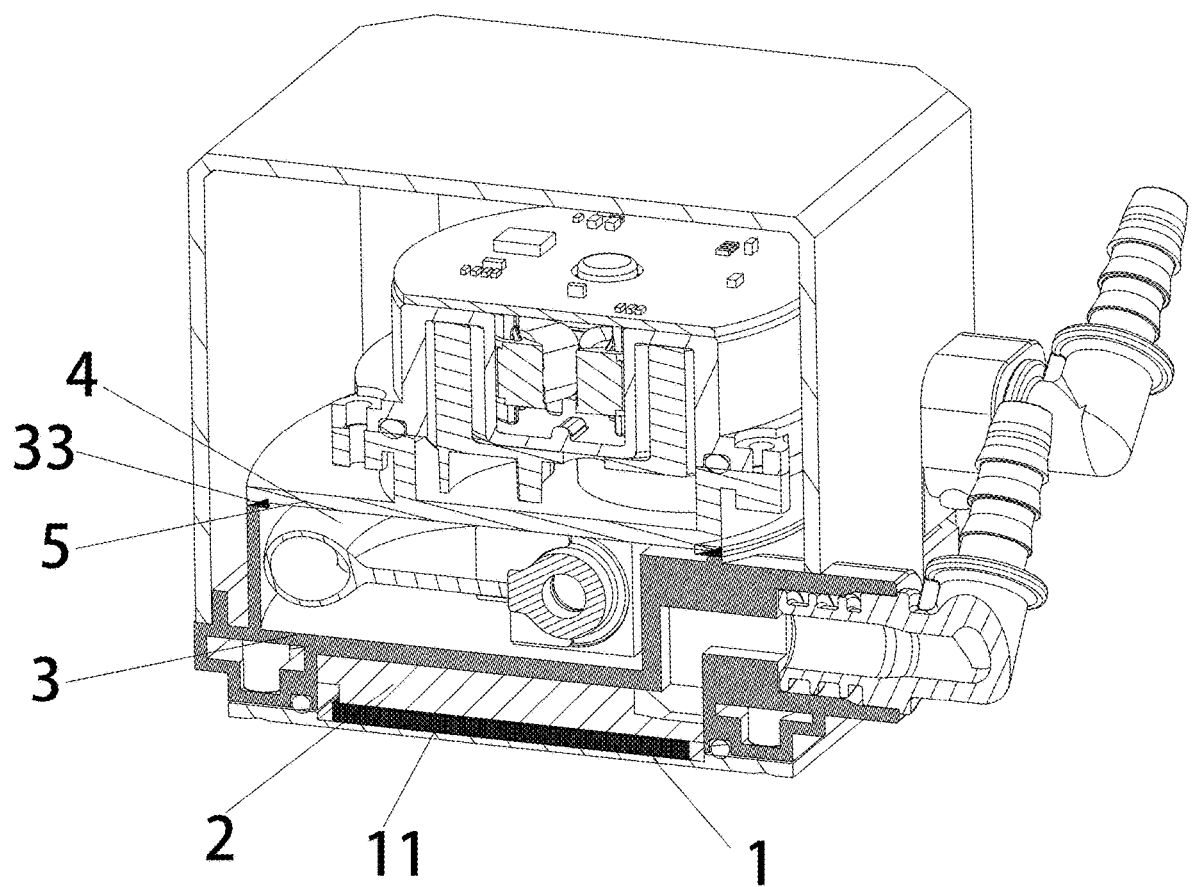
FIG. 3 is sectional view I of the present invention.
Figure 4:
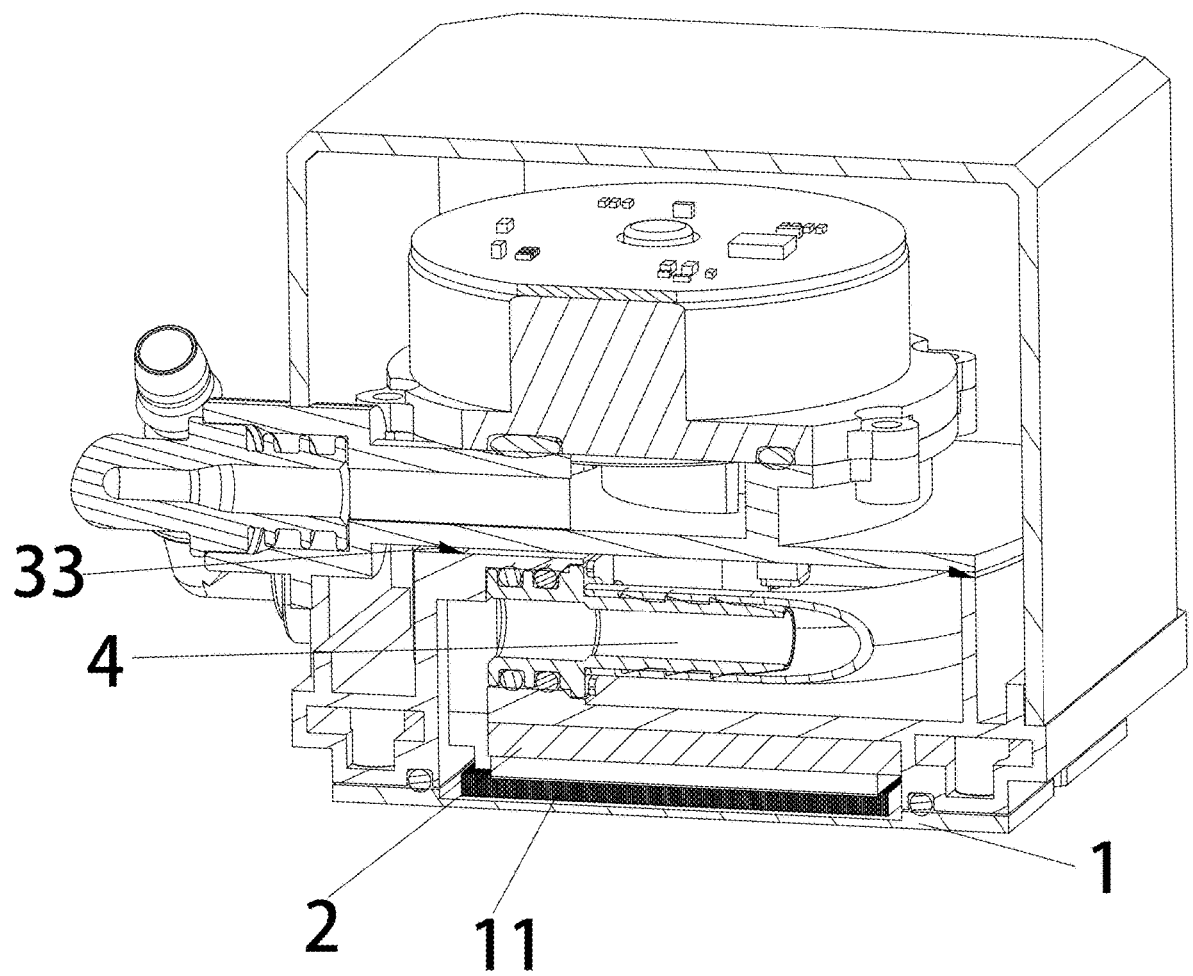
FIG. 4 is sectional view II of the present invention.
Figure 5:
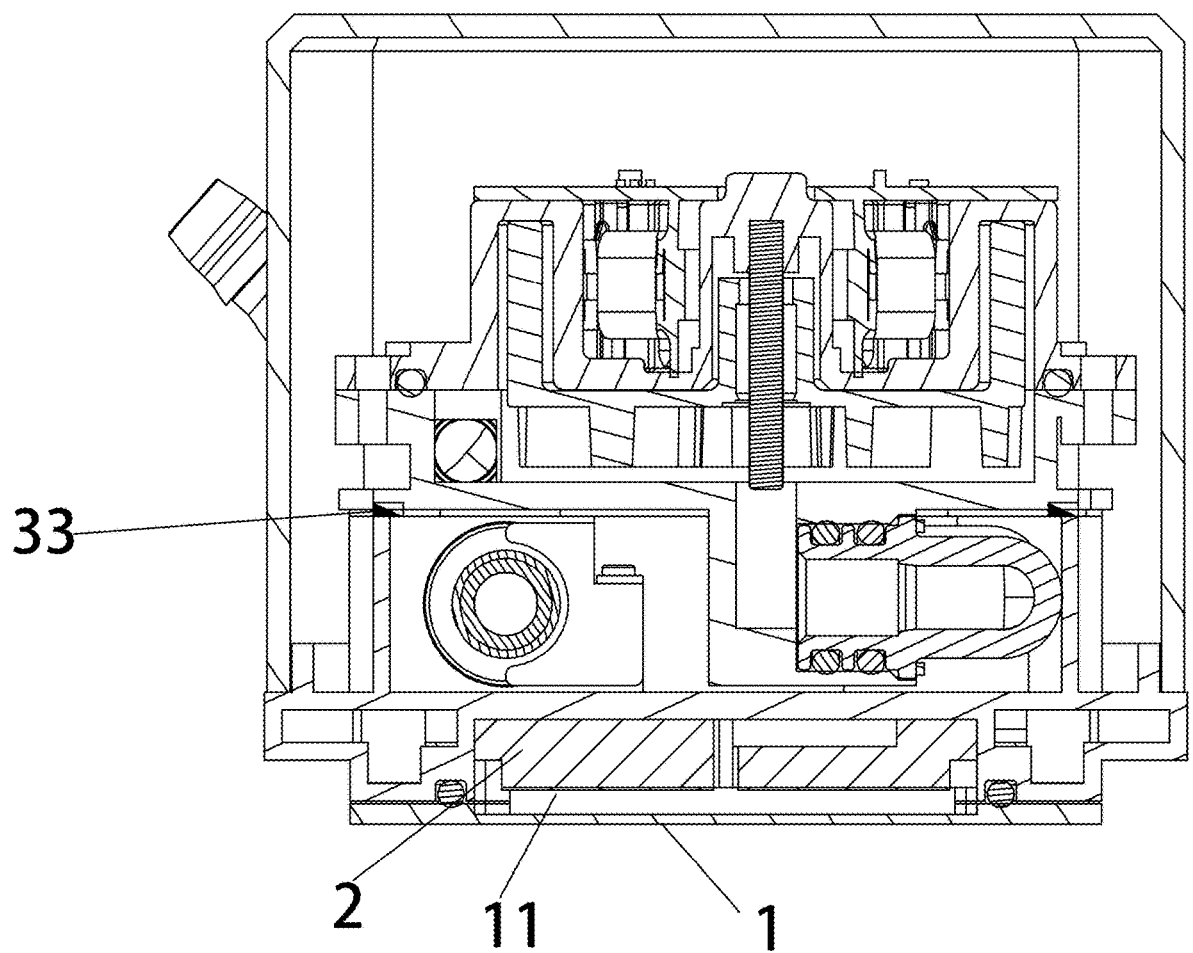
FIG. 5 is sectional view III of the present invention.
Figure 6:
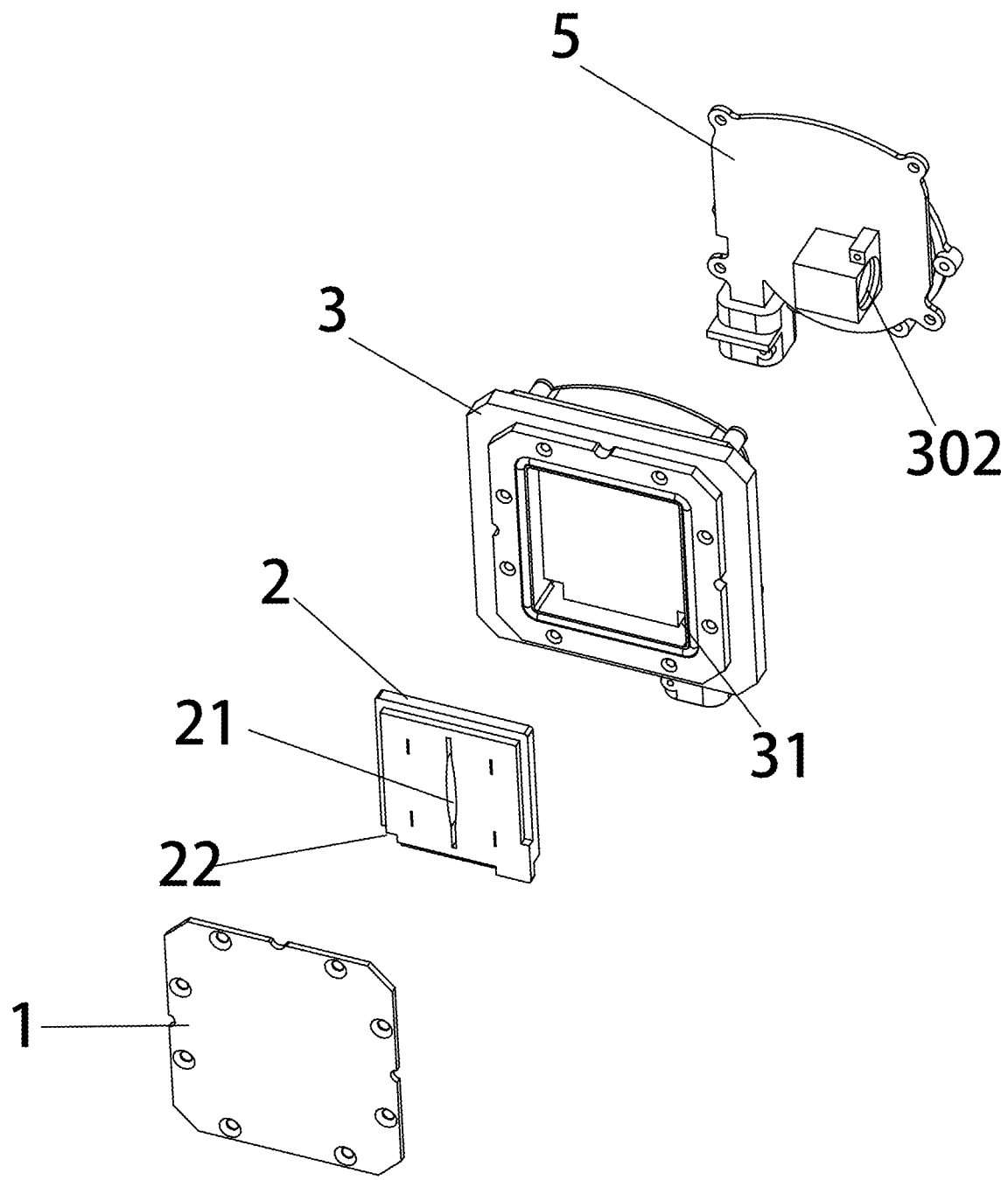
FIG. 6 is exploded view I of the first chamber and containment chamber.
Figure 7:
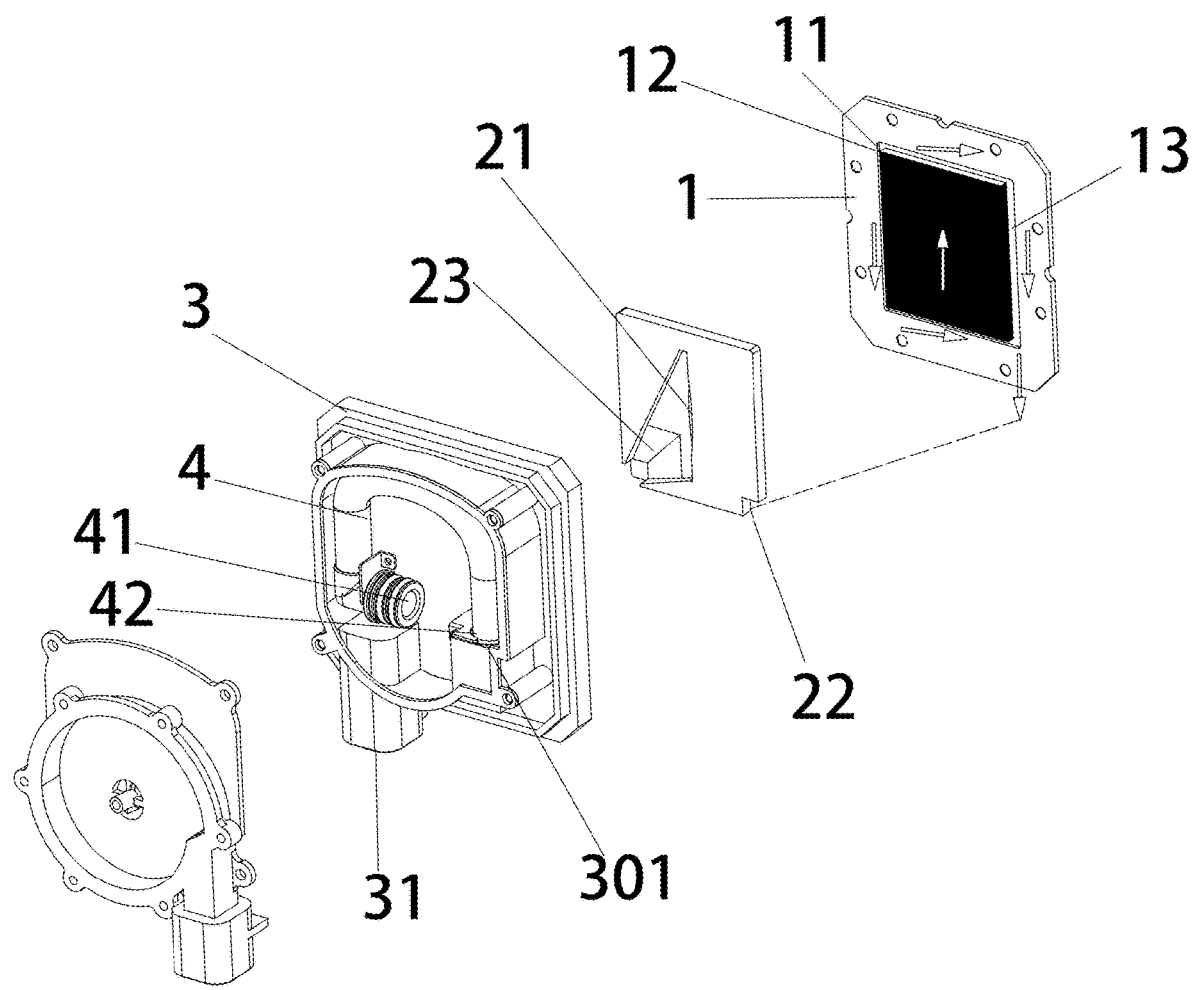
FIG. 7 is exploded view II of the first chamber and containment chamber.
Figure 8:
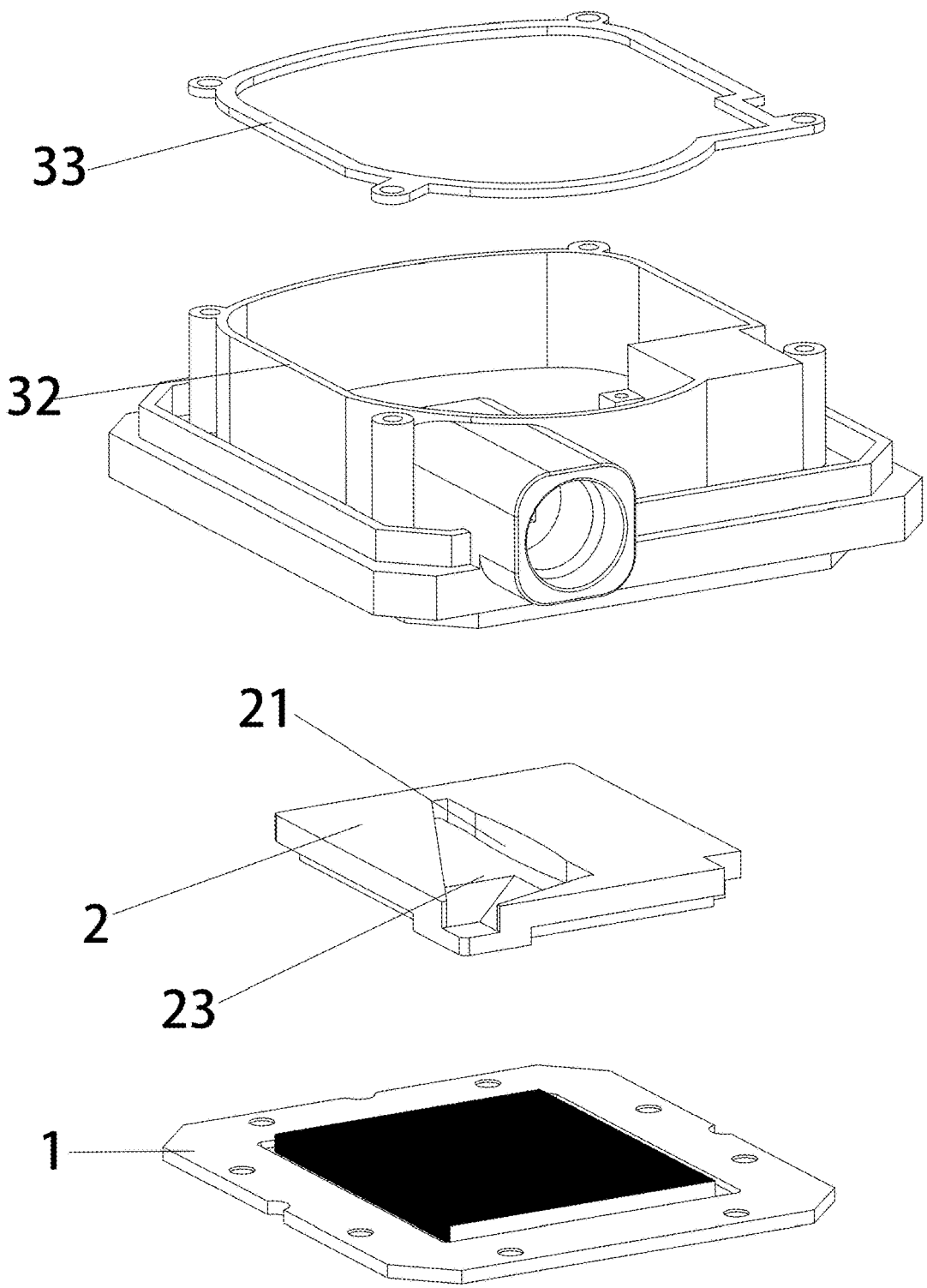
FIG. 8 is a schematic diagram of the fit between the water cooling plate and the bottom shell.
Figure 9:
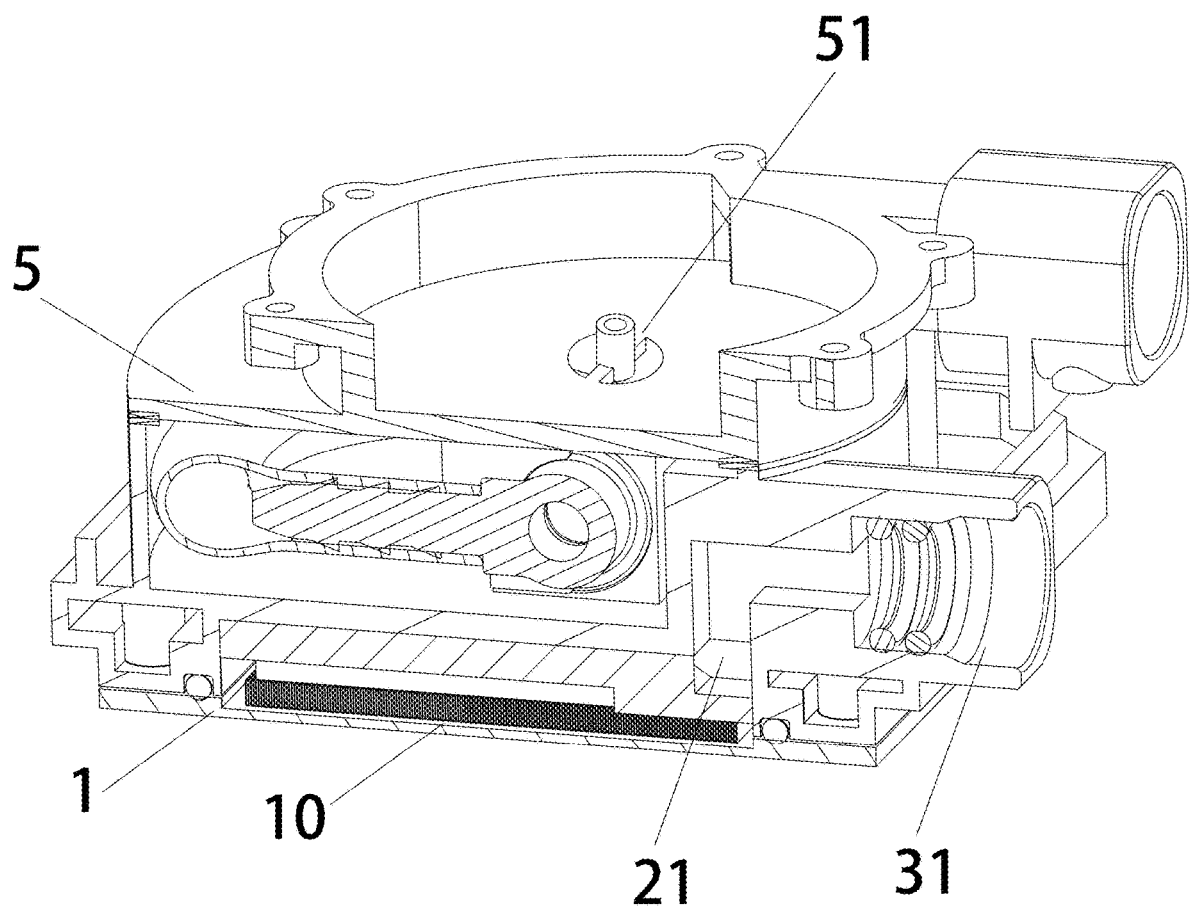
FIG. 9 is a semi sectional schematic diagram of the inlet pipe position.
Figure 10:
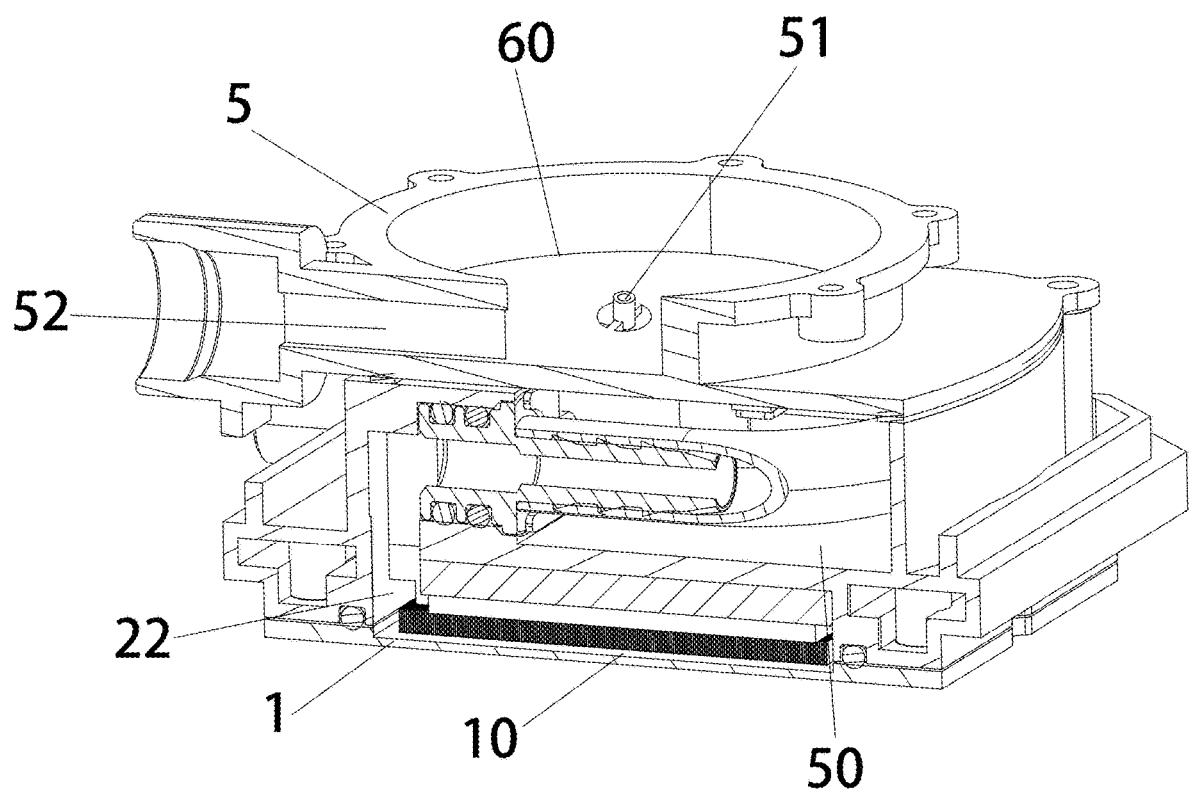
FIG. 10 is a semi sectional schematic diagram of the first water outlet of splitter plate and the first end position of flexible pipe.
Figure 11:
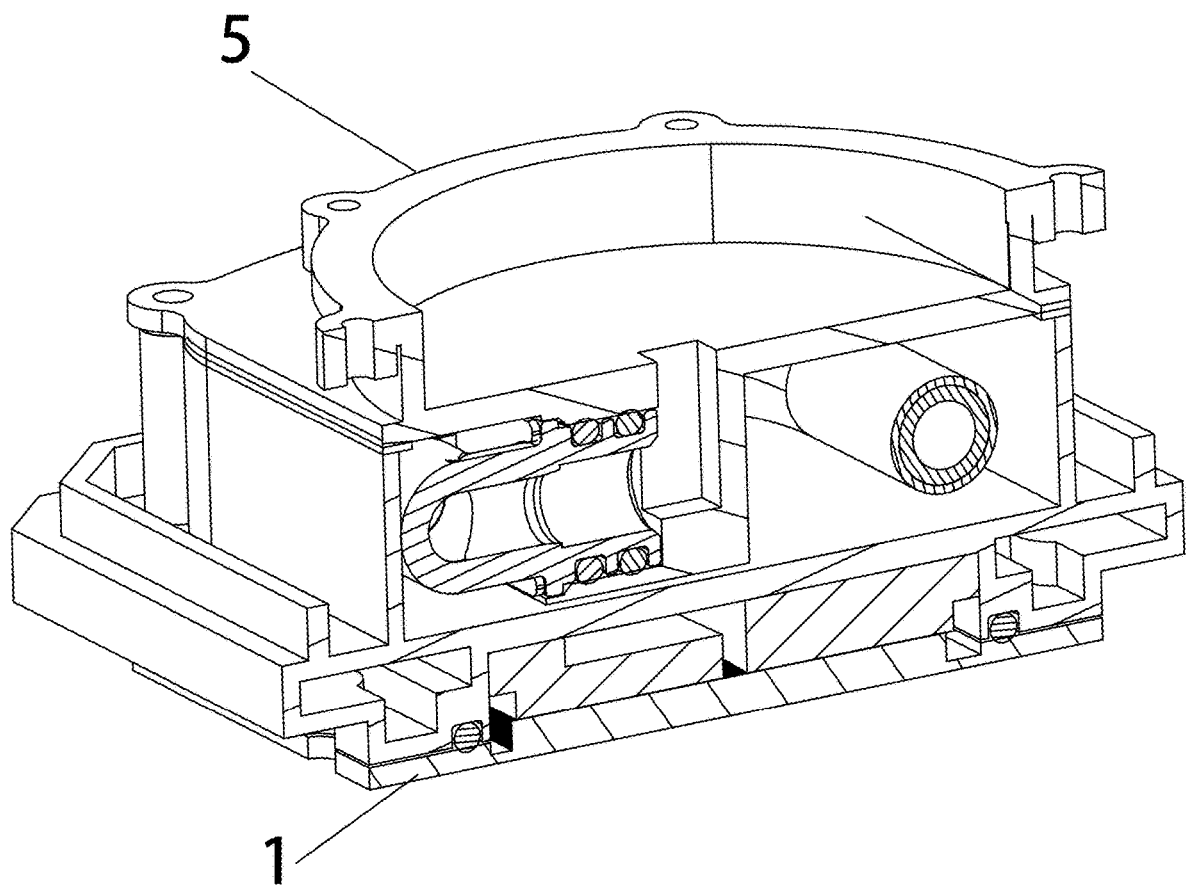
FIG. 11 is a semi sectional schematic diagram of the second end position of flexible tube.
Figure 12:
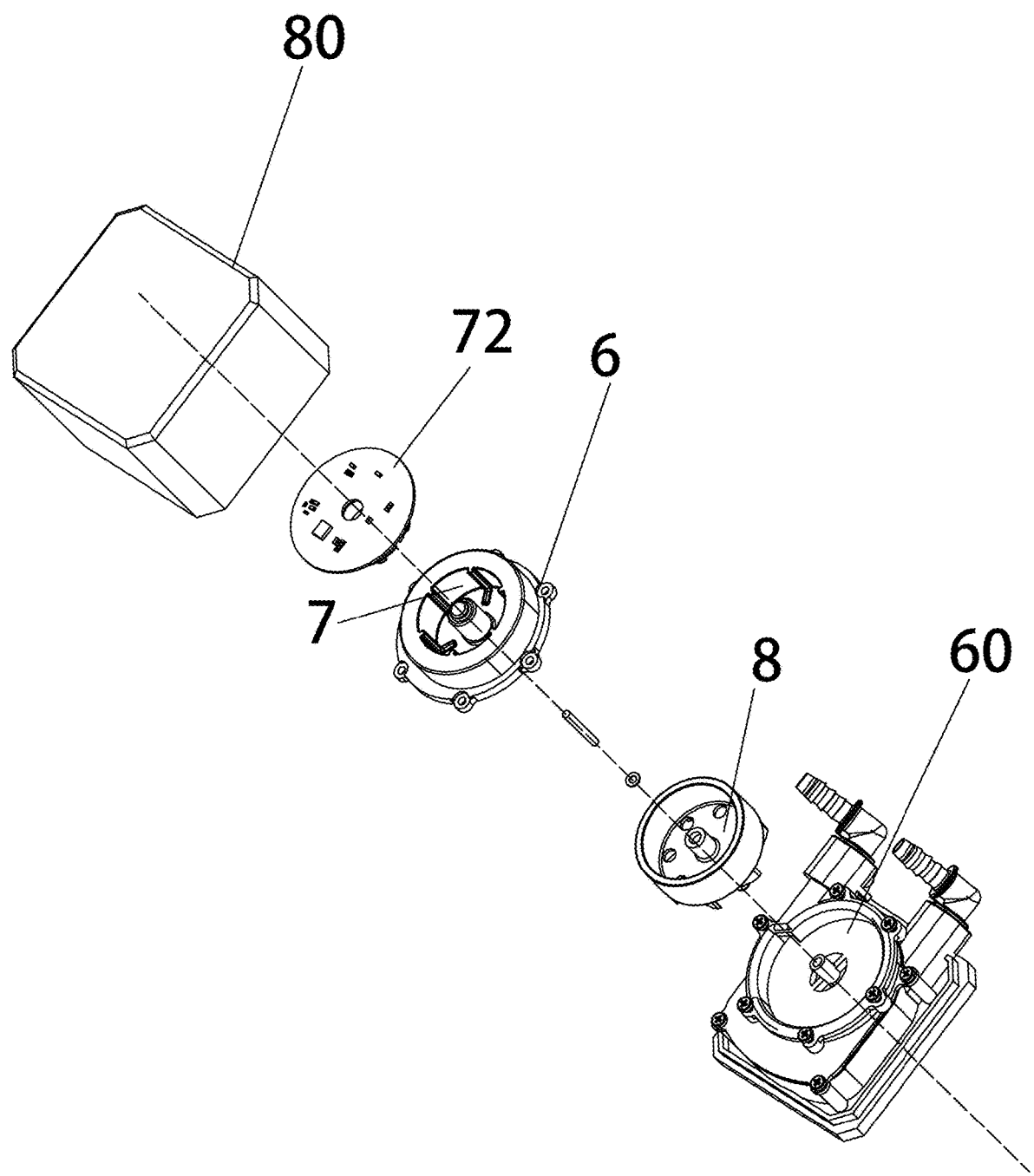
FIG. 12 is exploded view I of the second chamber position.
Figure 13:
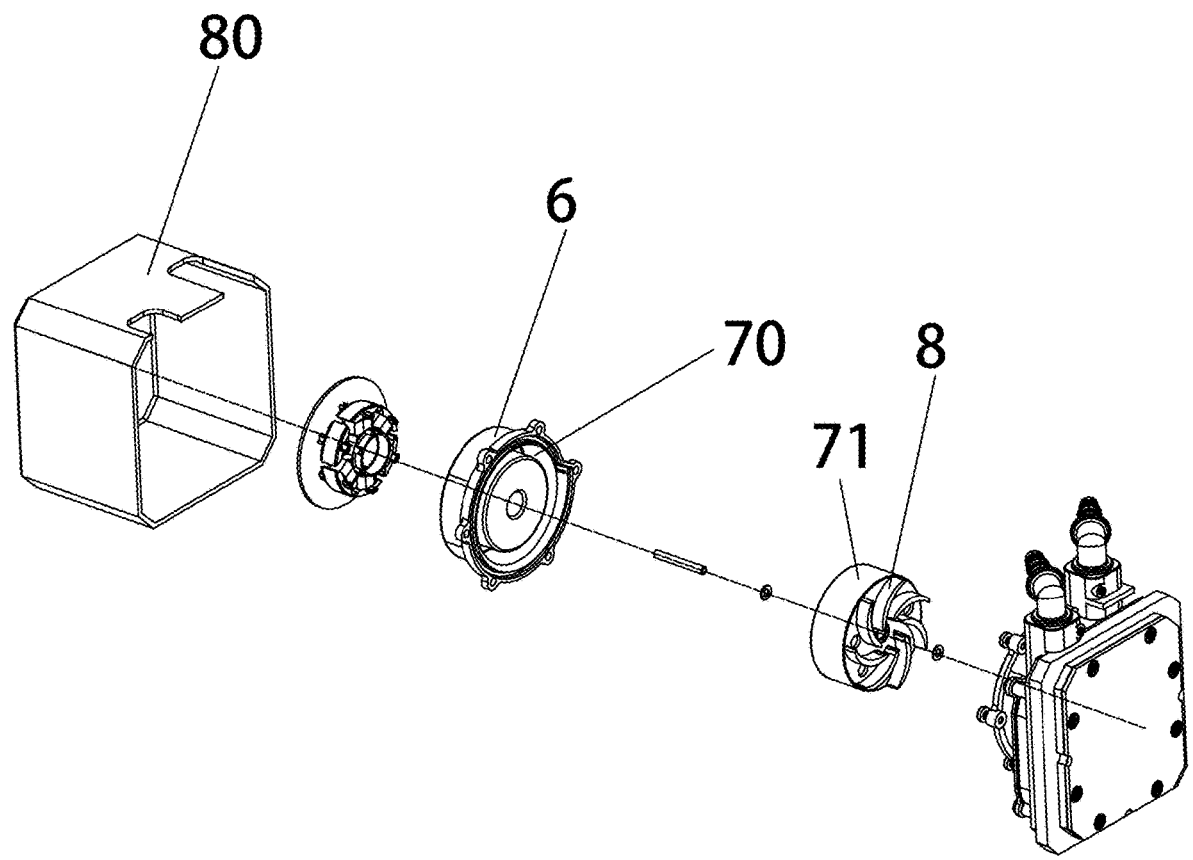
FIG. 13 is exploded view II of the second chamber position.
Figure 14:
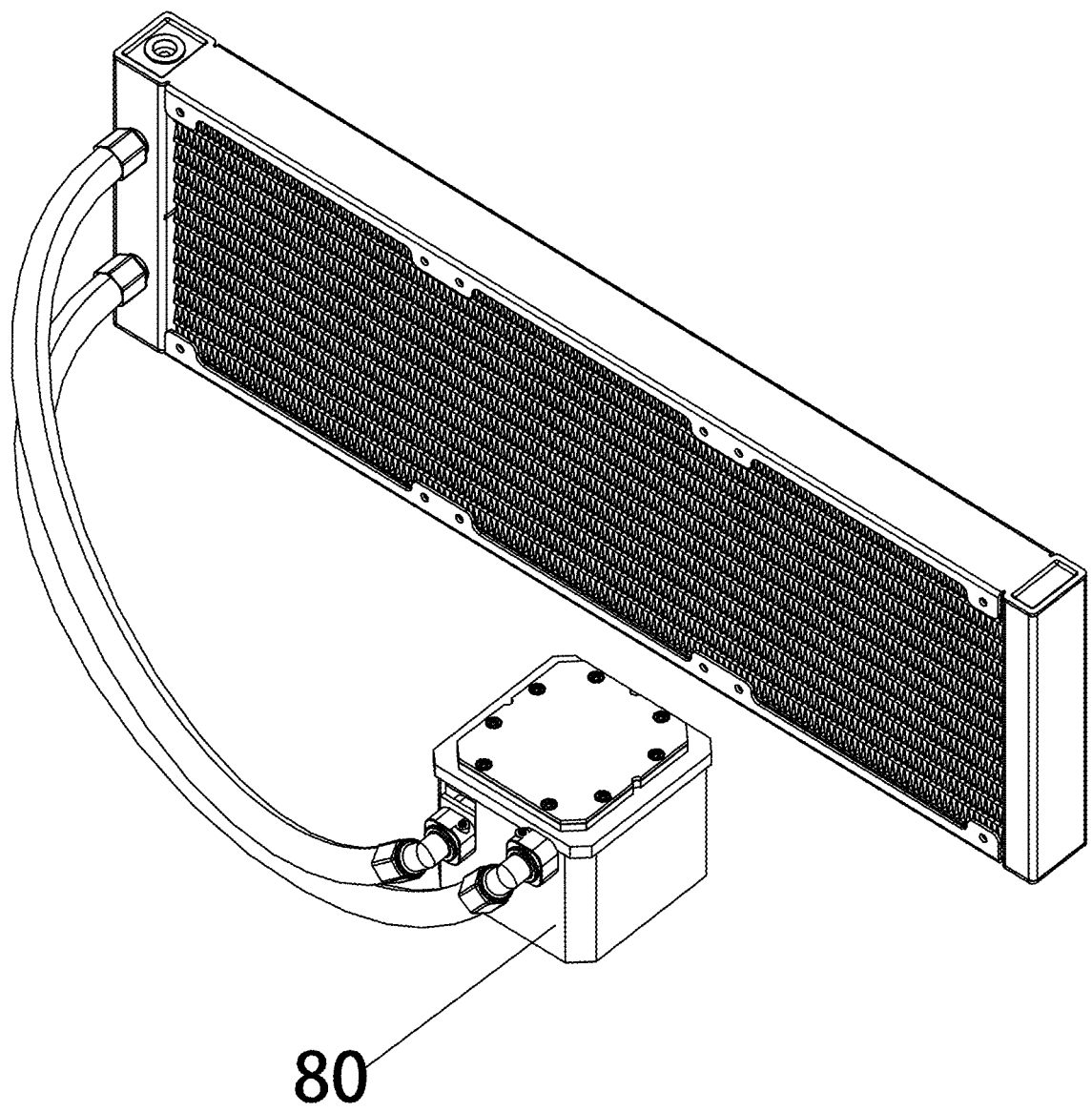
FIG. 14 is a 3D schematic diagram of the present application.

As shown in FIG. 1 to FIG. 9, a water cooling device with a shock-absorbing structure comprises:
  a water cooling plate 1, wherein the upper wall of the water cooling plate 1 (the lower wall is in contact with the heating device) is provided with a splitter plate 2, and the water cooling plate 1 and the splitter plate 2 enclose a first chamber 10;
  a first fluid inlet 21 runs through the middle of the splitter plate 2, a first fluid outlet 21 is provided outside the splitter plate 2, and the first chamber 10 is connected to the first fluid inlet 21 and the fluid outlet, respectively;
  a bottom shell, wherein one side of the bottom shell is provided with an inlet pipe 31 connecting to the first fluid inlet 21;
  one side of the bottom shell is provided with a flexible pipeline 4, and the first end 41 of the flexible pipeline 4 is connected to the first fluid outlet 22;
  and an upper shell 5, wherein the upper shell 5 is located on the upper wall of the bottom shell, and a shock-absorbing pad 33 is provided between the bottom shell and the upper shell 5, and the middle of the upper shell 5 is provided with a second fluid inlet 51 connecting to the second end of the flexible pipeline 4;
  a pump cover 6 is provided on the upper wall of the upper shell 5, and the upper shell 5 and pump cover 6 enclose a second chamber 60, the second fluid inlet 51 is provided at the bottom wall of the second chamber 60, and the second chamber 60 is rotatably installed with an impeller 8 having a rotor;
  a second fluid outlet 52 connecting to a water outlet pipe 61 is provided at the side wall of the second chamber 60;
  a stator that fits the device is provided at the upper wall of the pump cover 6;
  when the stator drives the rotor to rotate, fluid sequentially passes through the inlet pipe 31, first fluid inlet 21, first chamber 10, second fluid outlet 52, flexible pipe 4, second fluid inlet 51, second chamber 60, second fluid outlet 52, and outlet pipe 61.

In practical design, the inlet pipe 31 and outlet pipe 61 are located on the bottom shell and upper shell 5, and a shock-absorbing pad 33 between the bottom shell and upper shell 5 effectively reduces the vibration transmission of water pump during start-up or operation to the bottom shell, thereby providing a flexible connection, and unlike traditional structures, a bottom shell installed between the water cooling plate 1 and the upper shell 5 serve as a transition, and a flexible tube provides the flexible connection between the first chamber 10 and the second chamber 60, reducing the problem of resonance and improving the stability of the integrated use of water pump and water-cooled head;
  the inlet pipe 31 and outlet pipe 61 are respectively connected to the water cooling system or heat dissipation device, thereby improving the stability of heat dissipation.

Specifically, the first chamber 10 has a plurality of heat dissipation copper bars 11 spaced apart, and adjacent heat dissipation copper bars are surrounded by a heat dissipation water channel 12,
  a return channel 13 connecting to the first water outlet is provided at the periphery of the heat dissipation water channel 12; it can be understood as fluid flowing from the middle towards the periphery of the first chamber 10.

The first fluid inlet 21 is located at the middle position of the heat dissipation copper bar 11, further increasing the contact area of the fluid, reducing the flow blind spots of the fluid, and improving the stability of heat dissipation.

In the embodiments of the present invention, a groove 23 extends outward from the middle of the upper wall of the splitter plate 2, and the groove 23 is designed with reducing diameter from the outside to the inside, and the groove 23 and the lower wall of bottom shell enclose the first fluid inlet 21, and the groove 23 with reducing diameter can reduce the impact pressure when the fluid enters and increase the flow velocity of the fluid through a gradually reducing diameter structure, thereby improving the heat dissipation effect after entering the first chamber 10.

Specifically, the inlet pipe 31 is integrally formed on the bottom shell, and the inlet pipe 31 comprises a first vertical portion and a first guide hole extending vertically downward from the first vertical portion, and the first guide hole communicates with the first fluid inlet 21, mainly aiming to position the inlet pipe 31 and outlet pipe 61 on the same side wall.

In the embodiments of the present invention, the splitter plate 2 is made of rubber material to reduce the vibration between water cooling plate 1 and the bottom shell, further improving the contact stability between water cooling plate 1 and the heating element.

Specifically, the bottom shell has a first connecting valve port, the lower end of the first connecting valve port 301 is connected to the first fluid outlet 22, and a side end of the first connecting valve port 301 is connected to the first end 41 of the flexible pipe;

a second connecting valve port 302 extending downward is provided at the middle of the bottom wall of upper shell 5, and is connected to the second end of the flexible tube, and the upper end of the second connecting valve port 302 communicates with the second chamber 60.

In the embodiments of the present invention, the peripheral side of the bottom shell extends upward with a surrounding portion, the upper end wall of the surrounding portion is provided with the shock-absorbing pad 33, and the upper shell 5 is installed on the upper wall of the surrounding portion, and the fixed structure is preferably screw fixed.

Specifically, a containment chamber is enclosed between the surrounding portion and the lower wall of the upper shell 5, facilitating the installation of flexible pipes and serving as a connector.

In the embodiments of the present invention, a concave positioning shell 7 is provided in the middle of the pump cover 6, the outer wall of positioning shell 7 and the inner wall of pump cover 6 enclose a driving clearance 70, the impeller is provided with an upward extending rotor 71 between the driving clearance, the upper wall of positioning shell encloses a driving cavity where the stator 72 is located, and the positioning shell provides the separation of water and electricity between the rotor and stator.

Specifically, the stator is a magnetic induction coil, the device is a permanent magnet, the pump cover 6 has a decorative cover 80 that wraps the upper shell 5 inside, and the lower end of the decorative cover 80 is disposed at the outer edge of bottom shell.

The above are only the preferred embodiments of the present invention, and are not intended to limit the present invention. Any equivalent structural transformation made based on the description and accompanying drawings hereof under the concept of present invention, or be directly/indirectly applied in other related technical fields, should fall within scope of patent protection of the present invention.

What is claimed is:

1. A water cooling device with shock-absorbing structure, comprising:
    a water cooling plate, wherein the upper wall of a water cooling plate is provided with a splitter plate, and the water cooling plate and a splitter plate enclose a first chamber; a first fluid inlet runs through the middle of the splitter plate, a first fluid outlet is provided outside the splitter plate, and the first chamber is connected to the first fluid inlet and the fluid outlet, respectively;
    a bottom shell, wherein one side of the bottom shell is provided with an inlet pipe connecting to the first fluid inlet;
    one side of the bottom shell is provided with a flexible pipeline, and a first end of the flexible pipeline is connected to the first fluid outlet;
    and an upper shell, wherein the upper shell is located on an upper wall of the bottom shell, and a shock-absorbing pad is provided between the bottom shell and the upper shell, and a middle of the upper shell is provided with a second fluid inlet connecting to the second end of the flexible pipeline;
    a pump cover is provided on the upper wall of the upper shell, and the upper shell and pump cover enclose a second chamber, the second fluid inlet is provided at a bottom wall of the second chamber, and the second chamber is rotatably installed with an impeller having a rotor;
    a second fluid outlet connecting to a water outlet pipe is provided at the side wall of the second chamber;
    a stator is provided at an upper wall of the pump cover;
    when the stator drives the rotor to rotate, fluid sequentially passes through the inlet pipe, first fluid inlet, first chamber, second fluid outlet, flexible pipe, second fluid inlet, second chamber, second fluid outlet, and outlet pipe.

2. The water cooling device with shock-absorbing structure according to claim 1, wherein the first chamber has a plurality of heat dissipation copper bars spaced apart, and adjacent heat dissipation copper bars are surrounded by a heat dissipation water channel,
    a return channel connecting to a first water outlet is provided at the periphery of the heat dissipation water channel;
    the first fluid inlet is located at a middle position of the heat dissipation copper bar.

3. The water cooling device with shock-absorbing structure according to claim 1, wherein a groove extends outward from a middle of an upper wall of the splitter plate, and the groove is designed with reducing diameter from the outside to the inside, and the groove and a lower wall of bottom shell enclose the first fluid inlet.

4. The water cooling device with shock-absorbing structure according to claim 1, wherein the inlet pipe is integrally formed on the bottom shell, and the inlet pipe comprises a first vertical portion and a first guide hole extending vertically downward from the first vertical portion, and the first guide hole communicates with the first fluid inlet.

5. The water cooling device with shock-absorbing structure according to claim 1, wherein the splitter plate is made of rubber material.

6. The water cooling device with shock-absorbing structure according to claim 1, wherein the bottom shell has a first connecting valve port, a lower end of the first connecting valve port is connected to the first fluid outlet, and a side end of the first connecting valve port is connected to the first end of the flexible pipe;
    a second connecting valve port extending downward is provided at a middle of a bottom wall of upper shell, and is connected to the second end of the flexible tube, and the upper end of the second connecting valve port communicates with the second chamber.

7. The water cooling device with shock-absorbing structure according to claim 1, wherein a peripheral side of the bottom shell extends upward with a surrounding portion, an upper end wall of the surrounding portion is provided with the shock-absorbing pad, and the upper shell is installed on the upper wall of the surrounding portion.

8. The water cooling device with shock-absorbing structure according to claim 7, wherein a containment chamber is enclosed between the surrounding portion and a lower wall of the upper shell.

9. The water cooling device with shock-absorbing structure according to claim 1, wherein a concave positioning shell is provided in a middle of the pump cover, the outer wall of positioning shell and the inner wall of pump cover enclose a driving clearance, the impeller is provided with an upward extending rotor between the driving clearance, a upper wall of positioning shell encloses a driving cavity where the stator is located.

10. The water cooling device with shock-absorbing structure according to claim 1, wherein the stator is a magnetic induction coil, the pump cover has a cover that wraps the upper shell inside, and the lower end of the cover is disposed at the outer edge of bottom shell.

\* \* \* \* \*